United States Patent [19]

Yoshida

[11] Patent Number: 5,375,090
[45] Date of Patent: Dec. 20, 1994

[54] SEMICONDUCTOR MEMORY DEVICE
[75] Inventor: Makoto Yoshida, Nara, Japan
[73] Assignee: Sharp Kabushiki Kaisha, Japan
[21] Appl. No.: 1,853
[22] Filed: Jan. 8, 1993
[30] Foreign Application Priority Data
  Jan. 10, 1992 [JP] Japan .................................. 4-003324
[51] Int. Cl.⁵ .......................... G11C 8/00; G11C 13/00
[52] U.S. Cl. ................................ 365/200; 365/230.03;
                                         365/230.06; 371/10.2
[58] Field of Search .............. 365/200, 230.03, 230.06;
                                         371/10.2, 10.3
[56] References Cited
  U.S. PATENT DOCUMENTS
  4,837,747 6/1989 Dosaka et al. ................... 365/200 X Primary Examiner—Eugene R. LaRoche
Assistant Examiner—Do Hyun Yoo
Attorney, Agent, or Firm—Morrison Foerster

[57] ABSTRACT

A semiconductor memory device of the present invention includes a plurality of blocks. Each of the blocks includes: a memory cell group including redundancy cells; a memory cell group selection decoder for, in response to an address signal indicative of an address in the memory cell group, selecting a memory cell having the address; and a redundancy decoder in which any address included in a memory cell group in any one of the blocks except for the block to which the redundancy decoder belongs can be registered, the redundancy decoder outputting a prescribed signal to all of the memory cell group selection decoders in the respective blocks, when the address indicated by the address signal is identical with the registered address. Each the memory cell group selection decoding comprising: forcedly selecting means for, when the prescribed signal is supplied from the redundancy decoder in the block to which the memory cell group selection decoder belongs, forcedly selecting the memory cell group in the block; and forcedly non-selecting means for, when the prescribed signal is supplied from the redundancy decoder in one of the blocks except for the block to which the memory cell group selection decoder belongs, forcedly not selecting the memory cell group in the block to which the memory cell group selection decoder belongs.

10 Claims, 6 Drawing Sheets

SEMICONDUCTOR MEMORY DEVICE

BACKGROUND OF THE INVENTION

1. Field of the Invention

The present invention relates to a semiconductor memory device having a redundancy system for memory cell failures.

2. Description of the Related Art

Since the number of bits used in a semiconductor memory device has increased remarkably in recent years, the semiconductor memory device should have a huge number of memory cells. In such a semiconductor memory device, for improving the access speed, all of the memory cells are usually divided into a plurality of blocks. The memory cells for one block constitute a memory cell group. As the number of memory cells is increased, the probability that failures occur in any memory cells is increased. Therefore, redundancy cells are provided in addition to regular memory cells. As a result, when a failure of the regular memory cell is found (hereinafter, a regular memory cell which is found to be a failure one is referred to as a failure memory cell), an access to a corresponding redundancy cell is substituted for an access to the failure memory cell. Thus, the production yield has been improved.

A conventional memory cell group selection circuit in the above-mentioned semiconductor memory device is shown in FIG. 4. For simplicity of the description, it is assumed that the memory cells are divided into four blocks and hence they constitute four memory cell groups 51 to 54. In the blocks corresponding to the memory cell groups 51 to 54, redundancy decoders 61 to 64 and memory cell group selection decoders 81 to 84 are provided, respectively.

A case of a normal access is described. An address signal which indicates a specific address of a memory cell to be accessed which is included in one of the memory cell groups is input into all of the memory cell group selection decoders 81-84. For example, it is assumed that the memory cell having the address indicated by the input address signal (hereinafter, such an address is referred to as an input address) is included in the memory cell group 51. The memory cell group selection decoder 81 in the same block decodes the input address, so as to select the memory cell group 51. Then, in the memory cell group 51 selected by the memory cell group selection decoder 81, a regular memory cell having the input address is accessed.

For example, when a failure memory cell is found in the memory cell group 51, the address of the failure memory cell is registered in the redundancy decoder 61 in the same block. After the registration, when the failure memory cell is to be accessed, the redundancy decoder 61 in which the address of the failure memory cell has been registered switches an enable signal (hereinafter, referred to as an ENB signal) to a high level. The memory cell group selection decoder 81 in the same block receives the high-level ENB signal and decodes the address of the failure memory cell, so as to select the memory cell group 51 in the corresponding block. In the memory cell group 51, a redundancy cell in the memory cell group 51 corresponding to the failure memory cell is actually accessed, instead of the failure memory cell.

FIG. 5 shows an exemplary structure of the redundancy decoder. Respective bit values of an input address which is input into the redundancy decoder are represented by A1 to A5. An address for a failure memory cell which is registered in the redundancy decoder is the address of the memory cell included in the memory cell group of the block to which the redundancy decoder belongs. In this example, an address of five bits A1-A5 "01110" for a failure memory cell is registered in the redundancy decoder. The number of bits of the address for a failure memory cell is not limited to five. One unit of the circuit shown in FIG. 5 is provided for one address to be registered.

A chip selection signal $\overline{CE}$ is commonly supplied to all the redundancy decoders in the respective blocks of the same chip. When the chip selection signal $\overline{CE}$ is set to be a low level, a chip including the redundancy decoder shown in FIG. 5 is selected. In the selected chip, a transistor 501 in each of the redundancy decoders is turned on, and the level of the node 509 is pulled up to the level of the power supply 508. At this time, if transistors 505a–505f and 506 which are grounded are all turned off, the redundancy decoder supplies a high-level ENB signal to the memory cell group selection decoder in the same block via a signal line 507. If any of the transistors 505a–505f and 506 are turned on, the voltage of the node 509 is grounded. As a result, the redundancy decoder supplies a low-level ENB signal to the memory cell group selection decoder in the same block via the signal line 507. An ON-resistance of the transistor 501 is set to be sufficiently larger than those of the transistors 505a–505f and 506.

Now, a manner for registering the address A1-A5 "01110" of the failure memory cell is described. Each of the redundancy decoders is provided with a circuit for inputting big values and inverted bit values therefrom of the address to be registered. Corresponding fuses which are connected to signal lines for inputting the respective bit values are caused to blow, whereby the address is registered. When an address signal A1-A3 "011" is input, all of the transistors 505a–505f should be in the OFF state, in order to set the ENB signal at the high level. However, with the above configuration, the transistors 505b, 505c and 505e into which high-level address signals $\overline{A1}$, A2 and A3 are input are in the ON state. Therefore, in order to disconnect the transistors 505b, 505c and 505e from the circuit, corresponding fuses 504b, 504c and 504e are caused to blow. As a result, even when the transistors 505b, 505c and 505e are in the ON state, the voltage of the node 509 is not grounded. When the address signal A4-A5 "10" is input, a value obtained by a NAND operation between A4 and $\overline{A5}$ is input so that the transistor 506 can be in the OFF state. In this case, the bit values A4 and A5 of the address to be registered are fixed. As described above, the fuses are caused to blow so that all the grounded transistors except for the transistor 501 may be in the OFF state when the address signal indicative of the registered address is input. Thus, when the address signal indicative of the registered address is input, the high-level ENB signal can be output. The blow of the fuse is performed, for example, by a laser trimmer.

FIG. 6 shows an exemplary configuration of the memory cell group selection decoder and an exemplary configuration of the memory cell group in the same block as the memory cell group selection decoder. The reference numeral 601 denotes part of the memory cell group selection decoder, and 602 the memory cell group. As an example, it is assumed that a five-bit address A1-A5 "01110" has been registered as an address of a failure memory cell in a redundancy decoder in the same block. The number of bits of the address for a failure memory cell is not limited to five. One unit of the part 601 of the memory cell group selection decoder is required for one registered address. An ENB signal from the redundancy decoder in the same block is supplied to the memory cell group selection decoder and the memory cell group 602 via a signal line 616. In this example case, a single address has been registered, so that a single unit of the part 601 is required in the memory cell group selection decoder. In other words, in this example, the part 601 corresponds to the memory cell group selection decoder (for example, 81), so that the part 601 is hereinafter referred to as the memory cell group selection decoder 601.

A case where a high-level ENB signal is supplied from the redundancy decoder when an address signal indicative of the registered address is input into the memory cell group selection decoder 601 is considered. In this case, an inverter 605 supplies a low-level signal to a plurality of NAND gates 612 in the memory cell group 602. When one of a plurality of row decoders 611 in the memory cell group 602 is selected, the selected row decoder 611 supplies a high-level signal to the NAND gate 612 to which the selected row decoder 611 is connected. The number of the row decoders 611 is, for example, 128 in one memory cell group 602. The output of the inverter 605 is at a low level, so that the output of an inverter 613 corresponding to the selected row decoder 611 is also at a low level. During when the output of the inverter 613 is at the low level, memory cells in a memory array 614 cannot be accessed.

In the above case, the redundancy decoder supplies a high-level ENB signal to a plurality of NAND gates 607 in the memory cell group 602 via the signal line 616. One of a plurality of row decoders 606 in the memory cell group 602 is selected. The selected row decoder 606 supplies a high-level signal to the NAND gate 607 to which the selected row decoder 606 is connected. The number of the row decoders 606 is, for example, 128 in one memory cell group 602. The ENB signal supplied to the memory cell group 602 is at the high level, so that the output of an inverter 608 corresponding to the selected row decoder 606 is also at a high level. When the output of the inverter 608 is at the high level, redundancy cells $610_1$–$610_n$ in a redundancy memory array 609 can be selected. The selected redundancy cells $610_1$–$610_n$ are a row of redundancy memory cells which are controlled by the selected row decoder 606. The number of the redundancy cells $610_1$–$610_n$ in one row is, for example, 64 (n=64). Thereafter, one cell to be accessed is selected among the row of redundancy cells $610_1$–$610_n$.

Next, another case where a low-level ENB signal is supplied from the redundancy decoder when an address signal indicative of the registered address is input into the memory cell group selection decoder 601 is considered. In this case, the output of the inverter 605 is at a high level. When one of the row decoders 611 is selected, the output of the inverter 613 corresponding to the selected row decoder 611 is at a high level. During when the output of the inverter 613 is at the high level, memory cells $615_1$–$615_n$ in the memory array 614 can be selected. The access method to the memory cell in the memory array 614 is the same as that to the redundancy cell in the redundancy memory array 609. Also, in the memory array 614, for example, 64 memory cells $615_1$–$615_{64}$ are connected in a row (n=64).

In the above case, the redundancy decoder supplies a low-level ENB signal to the plurality of NAND gates 607 in the memory cell group 602 via the signal line 616. One of the plurality of row decoders 606 is selected. The output of the inverter 608 corresponding to the selected row decoder 606 is at a low level. Therefore, the redundancy cells in the redundancy memory array 609 cannot be accessed.

As described above, in the conventional semiconductor memory device, when any one of the memory cell groups 51–54 has any failure memory cell, the address of the failure memory cell is registered in the corresponding one of the redundancy decoders 61–64 in the same block, whereby the access to a redundancy cell provided in the corresponding one of the memory cell groups 51–54 in the same block is substituted for the access to the failure memory cell.

In some cases, for example, when a lot of failure memory cells occur only in the memory cell group 51, the number of the failure memory cells sometimes exceeds the number of redundancy cells provided in the memory cell group 51. However, in the redundancy decoder 61 as shown in FIG. 4, an address of a failure memory cell included in its memory cell group 51 of the same block can only be registered in order to substitute a redundancy cell provided in the memory cell group 51 for the failure memory cell. Therefore, even if there are unused redundancy cells in the other memory cell groups 52–54, it is impossible to substitute any one of the unused redundancy cells in the other memory cell groups 52–54 for the failure memory cell in the memory cell group 51.

Thus, in the conventional semiconductor memory device, an address of a failure memory cell included in a memory cell group can be registered only in a corresponding redundancy decoder in the same block. As a result, when a lot of failure memory cells occur in a memory cell group of a certain block, unused redundancy cells in memory cell groups of the other blocks, if any, cannot be utilized, which causes a problem in that such a semiconductor memory device is considered to be a defective.

SUMMARY OF THE INVENTION

The semiconductor memory device of this invention includes a plurality of blocks. Each of the blocks includes: a memory cell group including redundancy cells; a memory cell group selection decoder for, in response to an address signal indicative of an address in the memory cell group, selecting a memory cell having the address; and a redundancy decoder in which any address included in a memory cell group in any one of the blocks except for the block to which the redundancy decoder belongs can be registered, the redundancy decoder outputting a prescribed signal to all of the memory cell group selection decoders in the respective blocks, when the address indicated by the address signal is identical with the registered address. Each of the memory cell group selection decoders includes: forcedly selecting means for, when the prescribed signal is supplied from the redundancy decoder in the block to which the memory cell group selection decoder belongs, forcedly selecting the memory cell group in the block; and forcedly nonselecting means for, when the prescribed signal is supplied from the redundancy decoder in one of the blocks except for the block to which the memory cell group selection decoder belongs, forcedly not selecting the memory cell group in the block to which the memory cell group selection decoder belongs.

According to another aspect of the present invention, a semiconductor memory method is provided in a semiconductor memory device including a plurality of blocks, each of the blocks including: a memory cell group including redundancy cells; a memory cell group selection decoder for, in response to an address signal indicative of an address in the memory cell group, selecting a memory cell having the address; and a redundancy decoder in which any address included in a memory cell group in any one of the blocks except for the block to which the redundancy decoder belongs can be registered, the redundancy decoder outputting a prescribed signal to all of the memory cell group selection decoders in the respective blocks, when the address indicated by the address signal is identical with the registered address. The method includes in each of the memory cell group selection decoders the steps of: forcedly selecting, when the prescribed signal is supplied from the redundancy decoder in the block to which the memory cell group selection decoder belongs, the memory cell group in the block; and forcedly not selecting, when the prescribed signal is supplied from the redundancy decoder in one of the blocks except for the block to which the memory cell group selection decoder belongs, the memory cell group in the block to which the memory cell group selection decoder belongs.

In a semiconductor memory device having the above configuration, in a redundancy decoder in each block, not only addresses of the memory cells included in a memory cell group in the block to which the redundancy decoder belongs but also addresses of the memory cells included in memory cell groups in blocks except for the block to which the redundancy decoder belongs can be registered. When a memory cell having a certain address which has been registered in any one of the redundancy decoders is to be accessed, the redundancy decoder in which the certain address is registered supplies a signal (hereinafter, referred to as a "failure signal") to the memory cell group selection decoders of all the blocks via signal lines (hereinafter, referred to as "failure signal lines").

When a memory cell group selection decoder receives a failure signal from a redundancy decoder in the same block, forcedly selecting means is executed. When the memory cell group selection decoder receives a failure signal from a redundancy decoder in one of the other blocks, forcedly non-selecting means is executed. More specifically, when the memory cell group selection decoder which receives the failure signal from the redundancy decoder in the same block forcedly selects a memory cell group in the same block by the forcedly selecting means, even if the failure memory cell to be accessed is included in a memory cell group in one of the other blocks. The memory cell group selection decoders in all the blocks except for the block to which the redundancy decoder which supplies the failure signal belongs will not select their memory cell groups of the respective blocks by the forcedly non-selecting means, even if the failure memory cell to be accessed is included in their memory cell groups of the respective blocks. Thus, any one of the memory cell group selection decoder selects its memory cell group of the same block in response to the failure signal. Then, the access to the selected memory cell group is substituted for the access to the memory cell group including the failure memory cell to be accessed, whereby a redundancy cell corresponding to the failure memory cell to be accessed in the selected memory cell group is accessed.

As a result, even when a failure memory cell is found in a memory cell group of a certain block, and all redundancy cells in the memory cell group of the same block have been already used for substitution, the address of the failure memory cell can be registered in a redundancy decoder of one of the other blocks in which its memory cell group has an unused redundancy cell, whereby the unused redundancy cell of the different block can be substituted for the failure memory cell.

By the failure signal, the memory cell group selection decoder can get at least the information whether the failure signal is supplied from the redundancy decoder of the same block or from the redundancy decoder of one of the other blocks.

Thus, the invention described herein makes possible the advantage of providing a semiconductor memory device in which any addresses included in memory cell groups of all blocks can be registered in any one of redundancy decoders, whereby, even when failure memory cells occur in a certain block, unused redundancy cells in the other blocks can effectively be utilized.

This and other advantages of the present invention will become apparent to those skilled in the art upon reading and understanding the following detailed description with reference to the accompanying figures.

DESCRIPTION OF THE PREFERRED EMBODIMENTS

Figure 1:
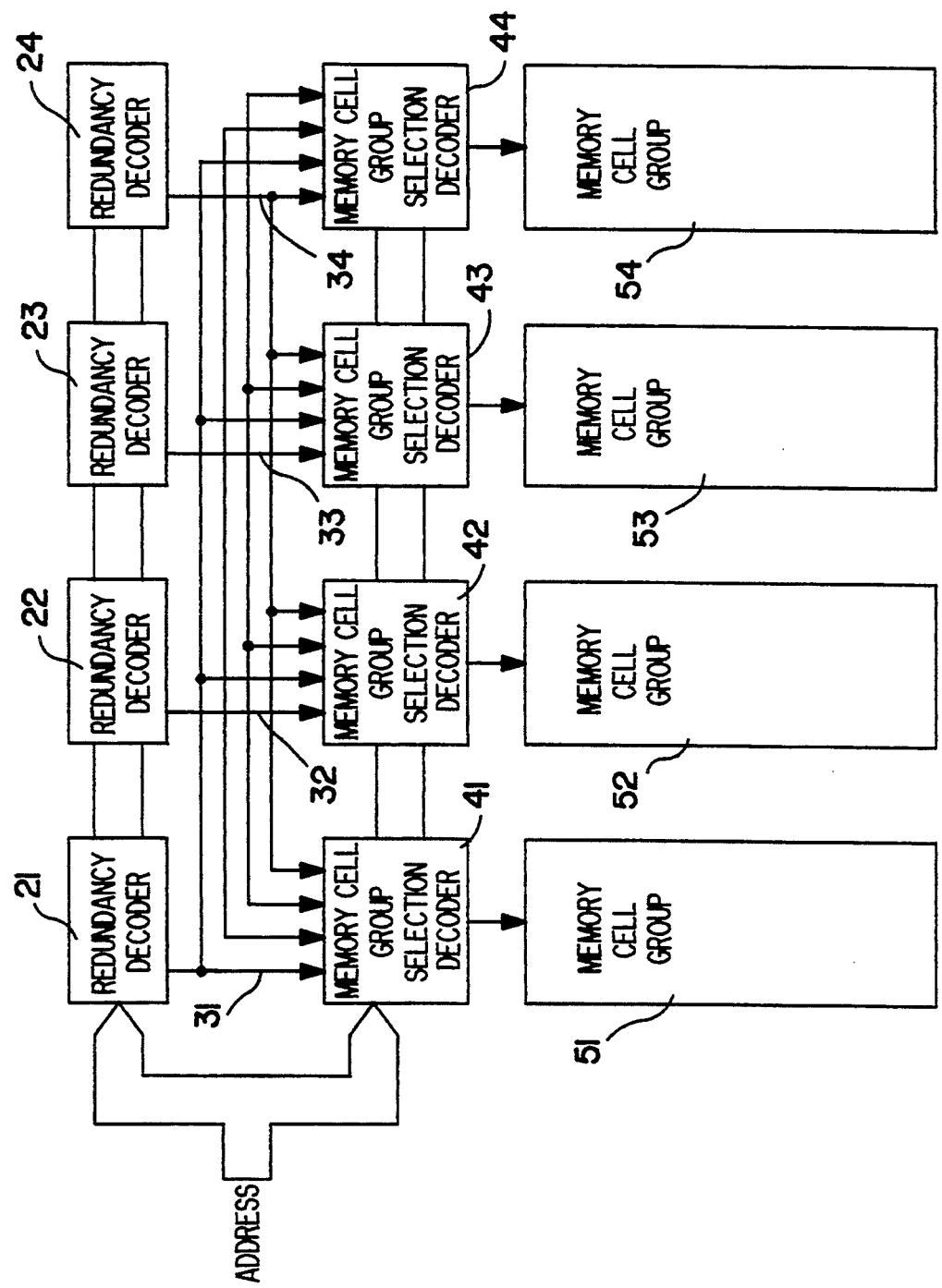
FIG. 1 is a block diagram showing an example according to the present invention.

FIG. 1 shows an example according to the present invention. In this example, as in the above-mentioned conventional one, memory cells are divided into four blocks. The memory cells in the respective blocks constitute memory cell groups 51–54.

The blocks include redundancy decoders 21–24, respectively. In the redundancy decoders 21–24, any addresses of the memory cells included in the memory cell groups 51–54 can arbitrarily registered irrespective of the blocks. An address signal is input into all the redundancy decoders 21–24. When the input address of the memory cell to be accessed is identical with an address which has been registered in one of the redundancy decoders 21–24, the redundancy decoder switches an ENB signal as the output thereof to a high level. The ENB signals output from the redundancy decoders 21–24 are separately input into memory cell group selection decoders 41–44 via ENB signal lines 31–34, respectively.

The address of the memory cell to be accessed is also input into the memory cell group selection decoders 41–44. One of the memory cell group selection decoders (for example, 41) selects its memory cell group 51 of the same block, when the memory cell having the input address is included in the memory cell group 51. The memory cell group selection decoders 41–44 judge whether or not the memory cell having the input address is included in their memory cell groups of the respective blocks, for example, by judging whether the higher-order bits of the address are identical with predetermined values or not. However, the number of the bits of the address and the way of using the bits of the address are not limited to those shown in the example. On the other hand, when the memory cell group selection decoder (in this example, 41) receives a high-level ENB signal supplied from the redundancy decoder 21 in the same block via the ENB signal line 31, the memory cell group selection decoder 41 forcedly selects its memory cell group 51 in the same block, irrespective of the block in which the memory cell having the input address is included. When the memory cell group selection decoder 41 receives a high-level ENB signal supplied from any one of the other redundancy decoders 22–24, the memory cell group selection decoder 41 forcedly does not select its memory cell group 51 in the same block.

The operation of the memory cell group selection circuit in the semiconductor memory device having the above configuration will be described.

In the semiconductor memory device, when any failure memory cell is found in any one of the memory cell groups 51–54 (for example, in the memory cell group 51) during the production process thereof, the address corresponding to the failure memory cell is registered in any one of the redundancy decoders 21–24, whereby an address of a redundancy cell is substituted for the address of the failure memory cell. The registration is performed in the following manner. First, the address of the failure memory cell is usually attempted to be registered in the redundancy decoder 21 of the same block. If all the redundancy cells in the memory cell group 51 have been used for substitution, the address is then attempted to be registered in any one of the other redundancy decoders 22–24. Thus, in the latter case, a redundancy cell in any one of the memory cell groups 52–54 of the blocks other than the block to which the memory cell group 51 having the failure memory cell belongs is used for the substitution.

When an address signal is input during the operation of the semiconductor memory device, and the input address is not registered in any of the redundancy decoders 21–24, one of the memory cell groups 51–54 which includes the memory cell having the input address is selected by the corresponding one of the memory cell group selection decoders 41–44. In the selected one of the memory cell groups 51–54, a regular memory cell having the input address is accessed.

If the input address of the memory cell to be accessed has been registered in any one of the redundancy decoders 21–24 (for example, 21), only the redundancy decoder 21 in which the input address has been registered switches the ENB signal to a high level. By the high-level ENB signal, the memory cell group selection decoder 41 in the same block forcedly selects its memory cell group 51 in the same block, even when the memory cell having the input address is included in one of the other memory cell groups 52–54. The other memory cell group selection decoders 42–44 which receive the high-level ENB signal from the redundancy decoder 21 forcedly do not select their memory cell groups 52–54 in the respective blocks, even when the memory cell having the input address is included in one of the corresponding memory cell groups 52–54. In the selected memory cell group 51, a redundancy cell corresponding to the input address is accessed.

As described above, in a conventional semiconductor memory device, when a failure memory cell is found, for example, in the memory cell group 51, and all the redundancy cells in the memory cell group 51 have been used for the substitution for the other failure memory cells in the memory cell group 51, the semiconductor memory device is considered as a defective. On the contrary, according to the present invention, if there are any unused redundancy cells in any other memory cell groups 52–54, the address of the failure memory cell can be registered in a redundancy decoder corresponding to the memory cell group having the unused redundancy cell, for the purpose of substitution, whereby the semiconductor memory device can be considered as a good one. In such a semiconductor memory device, when an input address of the memory cell to be accessed is identical with the registered address, the redundancy decoder in which the address has been registered causes the corresponding memory cell group selection decoder to forcedly select its memory cell group in the same block. The memory cell group which originally includes the memory cell having the input address is forcedly not selected by the corresponding memory cell group selection decoder, whereby the substitution is performed between the different blocks.

As a result, in the semiconductor memory device in this example, even when a lot of failure memory cells occur in any specific memory cell groups, unused redundancy cells in any other memory cell groups can be effectively used for the purpose of substitution.

Figure 2:
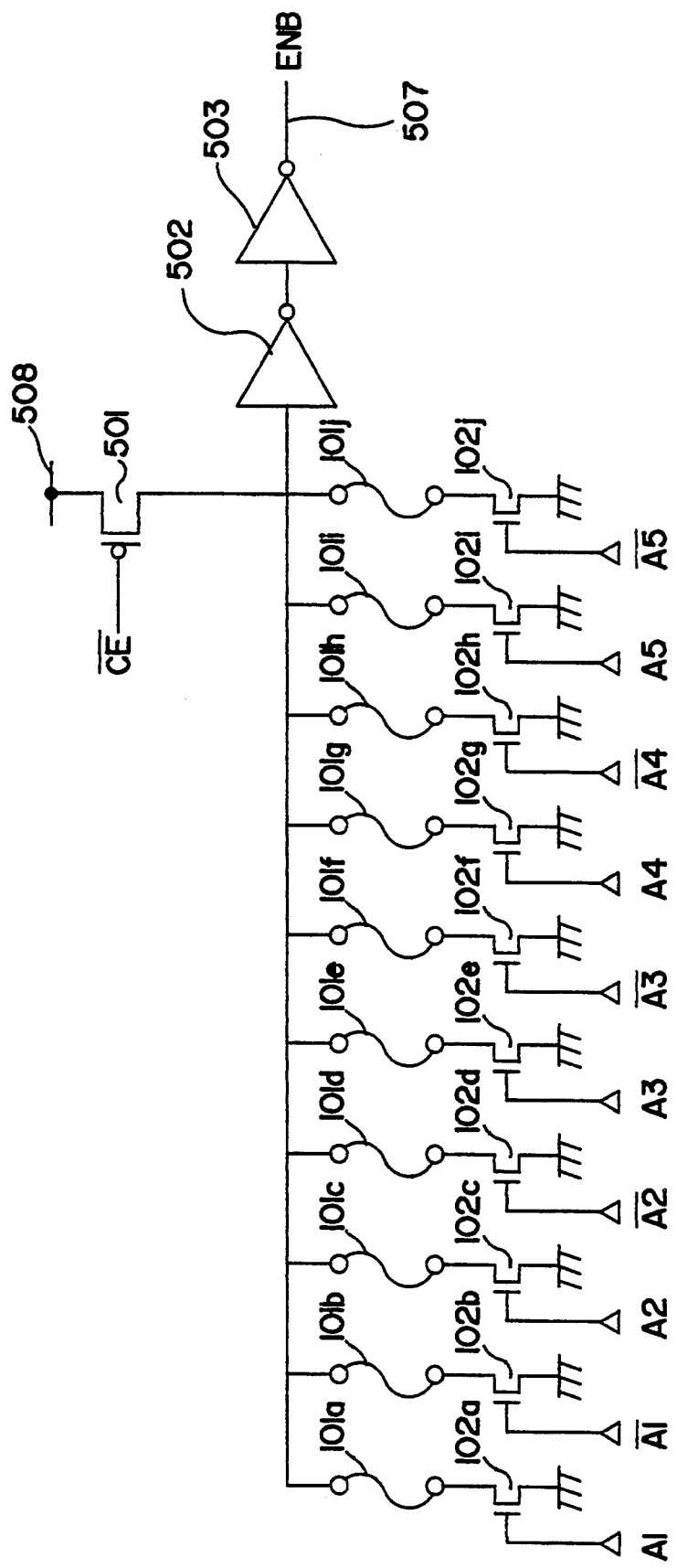
FIG. 2 shows an exemplary configuration of a redundancy decoder according to the present invention.

FIG. 2 shows an exemplary configuration of the redundancy decoder according to the present invention. With the conventional configuration shown in FIG. 5, the bit values A4 and A5 of the registered address are fixed. With the configuration shown in FIG. 2, fuses 101a–101j corresponding to all bits A1–A5 and $\overline{A1}$–$\overline{A5}$ of the address to be registered can be caused to blow. As a result, all the bits of the address to be registered can be set. In this example, the two bits A4 and A5 indicate a block in which its memory cell group includes the memory cell having the address. The number of blocks is not limited to four. Moreover, the number of the bits of the address and the way of using the bits of the address are either not limited to those shown in the example. Thus, an address of a failure memory cell can be registered in a redundancy decoder in any one of the other blocks.

Figure 3:
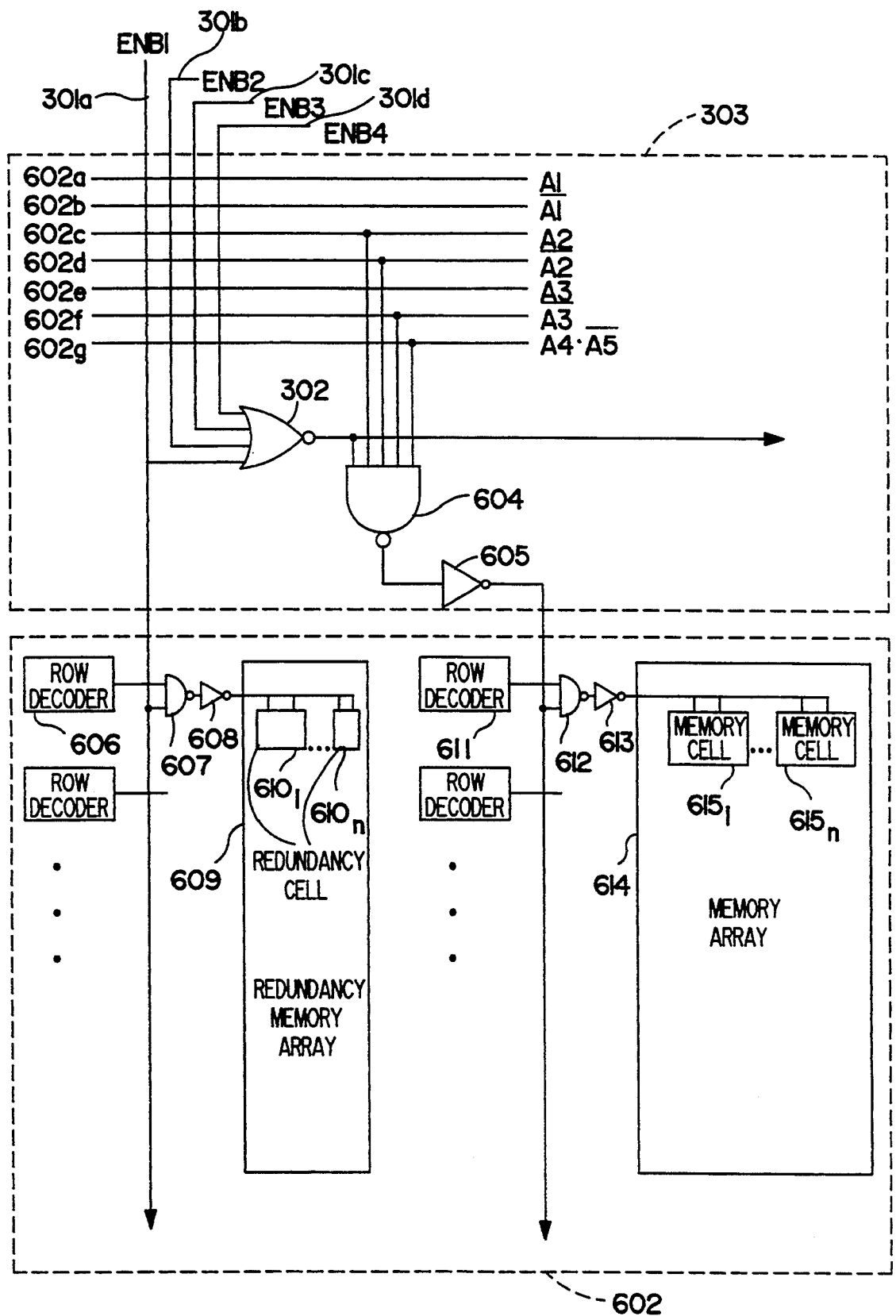
FIG. 3 shows an exemplary configuration of a memory cell group selection decoder and an exemplary configuration of a memory cell group corresponding thereto according to the present invention.
Figure 4:
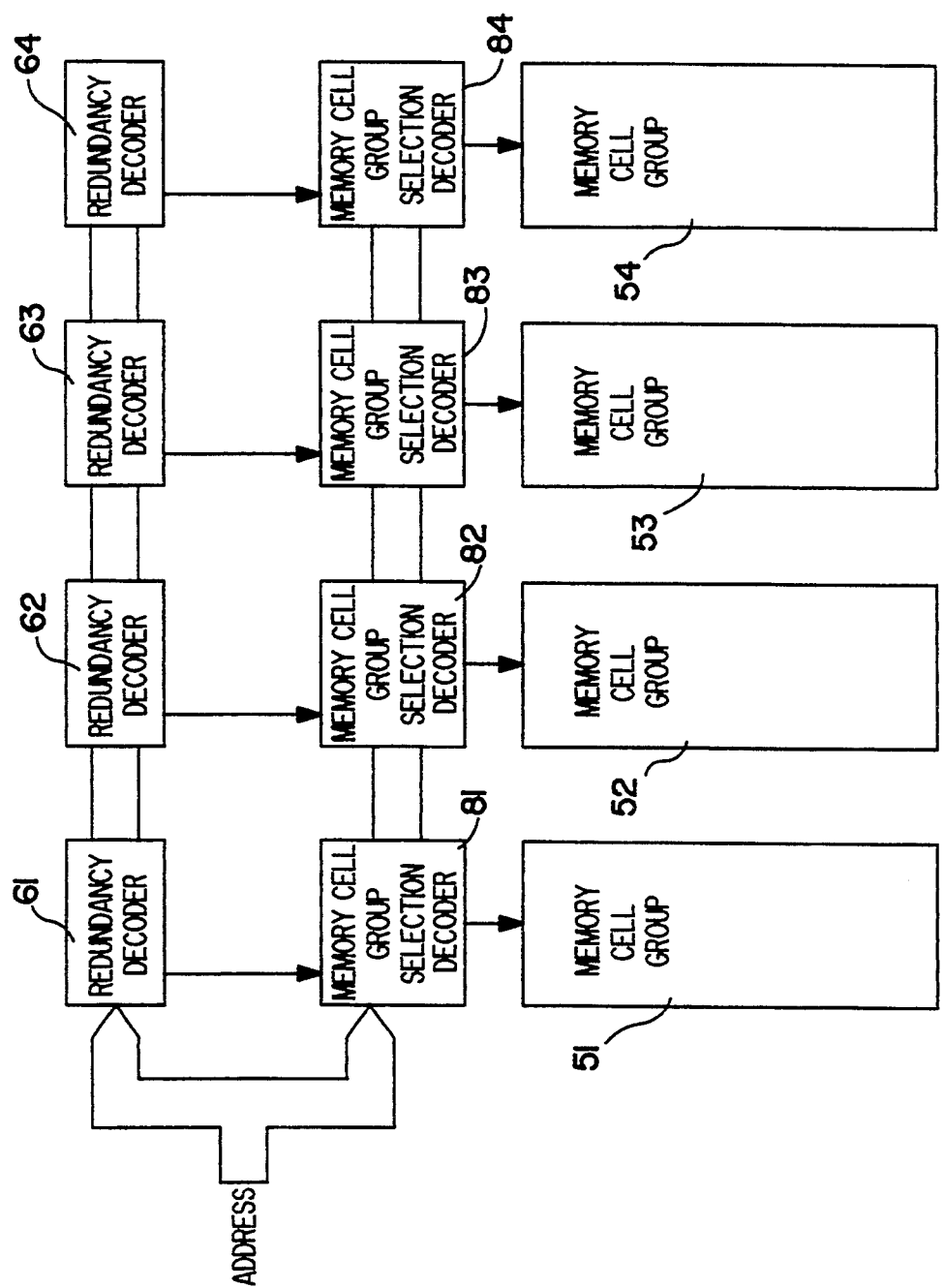
FIG. 4 is a block diagram showing a conventional semiconductor memory device.

FIG. 3 shows an exemplary configuration of a memory cell group selection decoder and an exemplary configuration of a memory cell group according to the present invention. In this example, memory cells are divided into four blocks which constitute four memory cell groups. In this example case, a single address has been registered, so that a single unit of a part 303 is required in the memory cell group selection decoder. In other words, in this example, the part 303 corresponds to the memory cell group selection decoder (for example, 41), so that the part 303 is hereinafter referred to as the memory cell group selection decoder 303. The memory cell group selection decoder 303 receives ENB signals ENB1–ENB4 from all redundancy decoders via signal lines 301a–301d. In an example shown in FIG. 3, the ENB signal ENB1 is supplied from the redundancy decoder in the same block. An address of a failure memory cell to be accessed consists of five bits A1–A5 "01110". The number of address bits of a failure memory cell is not limited to 5.

Now, a case where the address of the failure memory cell in a certain block has been registered in a redundancy decoder in the same block is described. When the failure memory cell is to be accessed, forcedly selecting means is used. The ENB signal ENB1 is at a high level, and other ENB signals ENB2–ENB4 are at a low level. Therefore, the output from a NOR gate 302 is at a low level. The output of an inverter 613 corresponding to a selected one of row decoders 611 is at a low level, so that memory cells in a memory array 614 cannot be accessed. On the other hand, the output of an inverter 608 corresponding to a selected one of row decoders 606 becomes a high level, so that redundancy cells in a redundancy memory array 609 can be accessed. The manner for accessing a memory cell in a memory array is the same as that for accessing a redundancy cell in a redundancy memory array in the conventional example.

Next, a case where the address of the failure memory cell in a certain block has been stored in a redundancy decoder in one of the other blocks is described. In this case, when the failure memory cell is to be accessed, forcedly non-selecting means is used. It is assumed that the ENB signal ENB2 is at a high level. The other ENB signals ENB1, ENB3, and ENB4 are at a low level. As a result, the output from the NOR gate 302 is at a low level as in the forcedly selecting means. Therefore, also in this case, the memory cells in the memory array 614 cannot be accessed. The output of an inverter 608 corresponding to a selected one of the row decoders 606 becomes a low level, so that the redundancy cells in the redundancy memory array 609 cannot be either accessed.

As apparent from the above description, according to the semiconductor memory device of the present invention, even when redundancy cells in a memory cell group in a certain block run short due to a lot of failure memory cells, unused redundancy cells in memory cell groups in the other blocks can effectively be used, whereby the production yield of the semiconductor memory device can be improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising a plurality of blocks, each of said blocks comprising:
   a memory cell group including redundancy cells;
   a memory cell group selection decoder for, in response to an address signal indicative of an address in said memory cell group, selecting a memory cell having said address; and
   a redundancy decoder in which any address included in the memory cell group in any one of said blocks can be registered, said redundancy decoder outputting a prescribed signal to all of said memory cell group selection decoders in said respective blocks, when the address indicated by said address signal is identical with the registered address,
   each of said memory cell group selection decoders comprising:
   forcedly selecting means for, when said prescribed signal is supplied from the redundancy decoder in the same respective block as said memory cell group selection decoder, forcedly selecting the memory cell group in said same block; and
   forcedly non-selecting means for, when said prescribed signal is supplied from the redundancy decoder in one of said other respective blocks to the redundancy decoder in said same block, forcedly not selecting the memory cell group in said same block to which said memory cell group selection decoder belongs.

2. A semiconductor memory device according to claim 1, wherein a selected one of said redundancy decoders has registered therein addresses of failure memory cells included in the same block as said selected redundancy decoder and addresses of failure memory cells at least one of said other blocks.

3. A semiconductor memory device according to claim 1, wherein each or said memory cell group selection decoders selects the memory cell group in the block to which said respective memory cell group selection decoder belongs when said address signal indicates the address in said memory cell group in the same block to which said respective memory cell group selection decoder belongs, and said respective memory cell group selection decoder receives none of said prescribed signals from said redundancy decoders.

4. A semiconductor memory device according to claim 3, wherein, when said respective memory cell group selection decoder selects the memory cell group included in the same block as said respective memory cell group selection decoder, a memory cell corresponding to the address indicated by said address signal is accessed.

5. A semiconductor memory device according to claim 1, wherein when said memory cell group selection decoders select the memory cell group in the block to which said respective memory cell group selection decoder belongs by said forcedly selecting means, a redundancy cell corresponding to the address indicated by said address signal in said memory cell group is accessed.

6. A semiconductor memory method in a semiconductor memory device comprising a plurality of blocks, each of said blocks comprising:
   a memory cell group including redundancy cells;
   a memory cell group selection decoder for, in response to an address signal indicative of an address in said memory cell group, selecting a memory cell having said address; and
   a redundancy decoder in which any address included in the memory cell group in any one of said blocks can be registered, said redundancy decoder outputting a prescribed signal to all of said memory cell group selection decoders in said respective blocks, when the address indicated by said address signal is identical with the registered address,
   said method comprising in each of said memory cell group selection decoders the steps of:
   forcedly selecting, when said prescribed signal is supplied from the redundancy decoder in the same respective block as said memory cell group selection decoder, the memory cell group in said same block; and forcedly not selecting, when said prescribed signal is supplied from the redundancy decoder in one of said other respective blocks to the redundancy decoder in said same block, the memory cell group in said same block to which said memory cell group selection decoder belongs.

7. A semiconductor memory method according to claim 6, comprising a step of registering in a selected one of said redundancy decoders addresses of failure memory cells in the same block as said selected redundancy decoder and addresses of failure memory cells in at least one of said other blocks.

8. A semiconductor memory method according to claim 6, comprising a step of selecting the memory cell group in the block to which a selected one of said memory cell group selection decoders belongs by means of said selected memory cell group selection decoder when said address signal indicates the address in said memory cell group in said block to which said selected memory cell group selection decoder belongs, and said selected memory cell group selection decoder receives none of said prescribed signals from said redundancy decoders.

9. A semiconductor memory method according to claim 8, comprising a step of accessing a memory cell corresponding to the address indicated by said address signal when said selected memory cell group selection decoder selects the memory cell group which belongs to the same block as said selected memory cell group selection decoder.

10. A semiconductor memory method according to claim 6, comprising a step of accessing, when said memory cell group selection decoders select the memory cell group in the block to which said respective memory cell group selection decoder belongs by said forcedly selecting step, a redundancy cell corresponding to the address indicated by said address signal in said memory cell group.

* * * * *

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

It is certified that error appears in the above-identified patent and that said Letters Patent is hereby corrected as shown below:

In the drawing:

In FIG. 1 the interconnections between Redundancy Decoders 21, 22, 23, and 24 and memory cell groups 41, 42, 43, and 44 are:

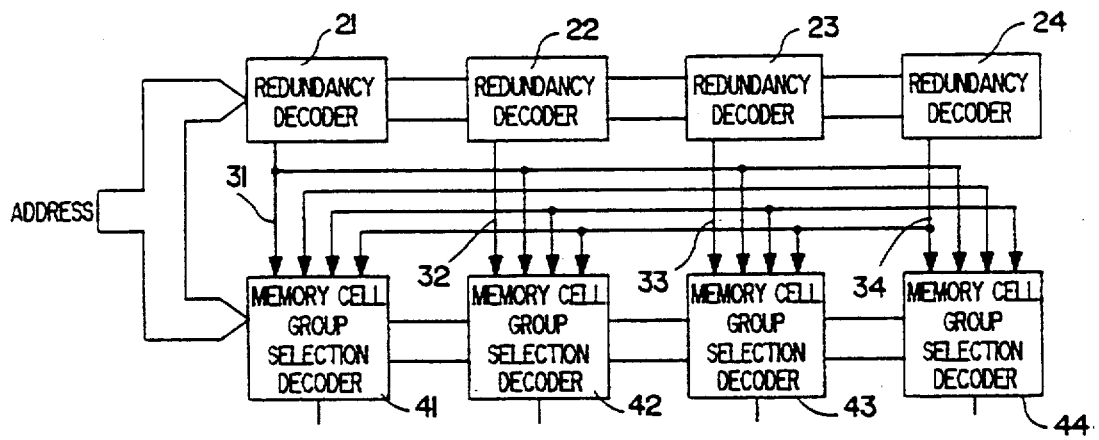

and should be: (see next page)

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

It is certified that error appears in the above-identified patent and that said Letters Patent is hereby corrected as shown below:

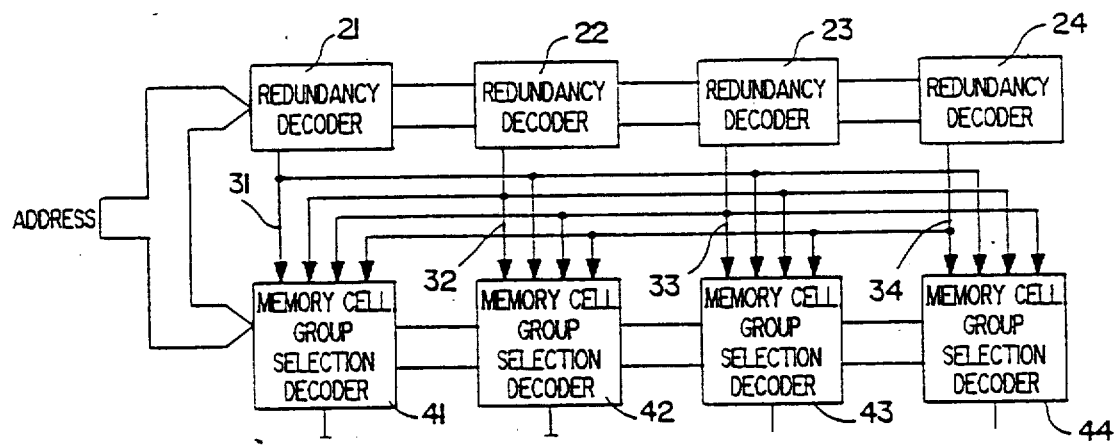

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

It is certified that error appears in the above-identified patent and that said Letters Patent is hereby corrected as shown below:

```
In FIG. 2 to the left of inverter 502 the connection is:
```

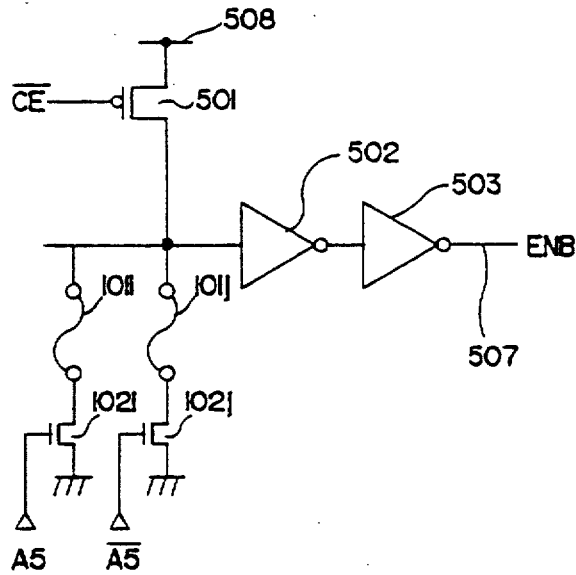

```
the connection should be: (see next page)
```

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

It is certified that error appears in the above-identified patent and that said Letters Patent is hereby corrected as shown below:

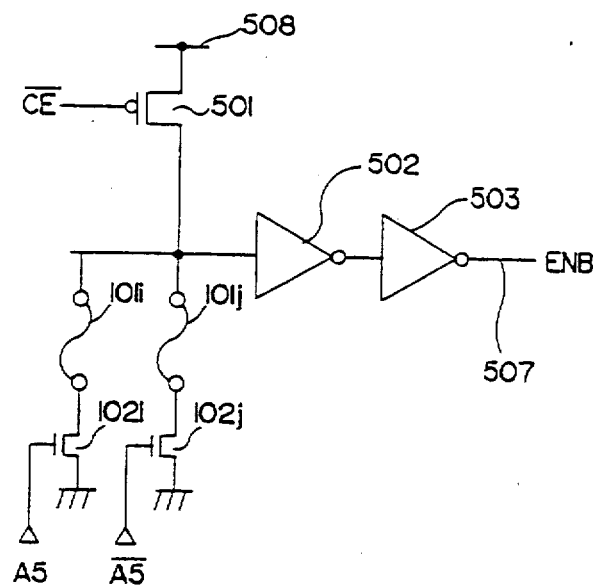

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

It is certified that error appears in the above-identified patent and that said Letters Patent is hereby corrected as shown below:

In FIG. 3 the interconnection between gate 604 and address lines 602a through 602g inside block 303 is

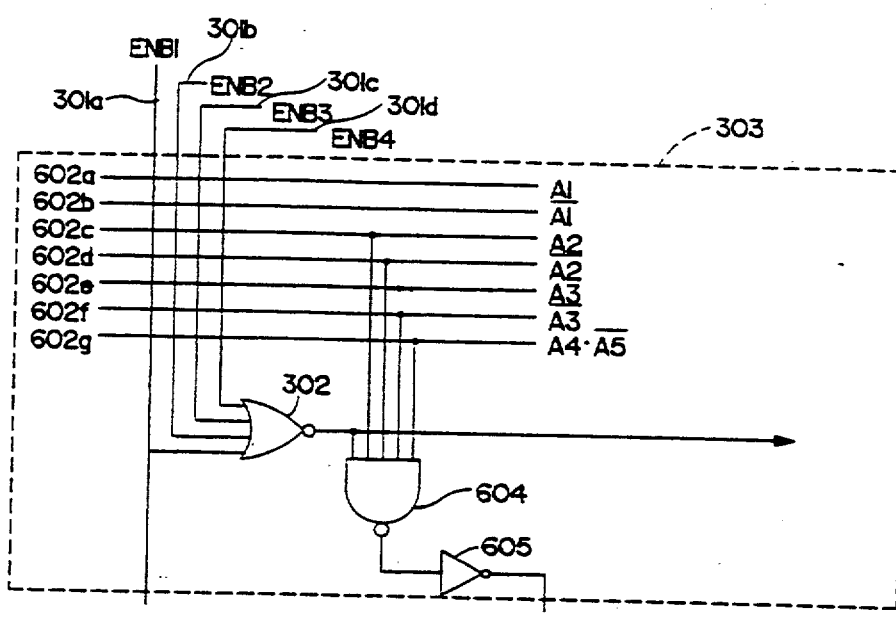

the connections should be: (see next page)

UNITED STATES PATENT AND TRADEMARK OFFICE
CERTIFICATE OF CORRECTION

PATENT NO. : 5,375,090  Page 6 of 11

DATED : DECEMBER 20, 1994

INVENTOR(S) : M. YOSHIDA

It is certified that error appears in the above-identified patent and that said Letters Patent is hereby corrected as shown below:

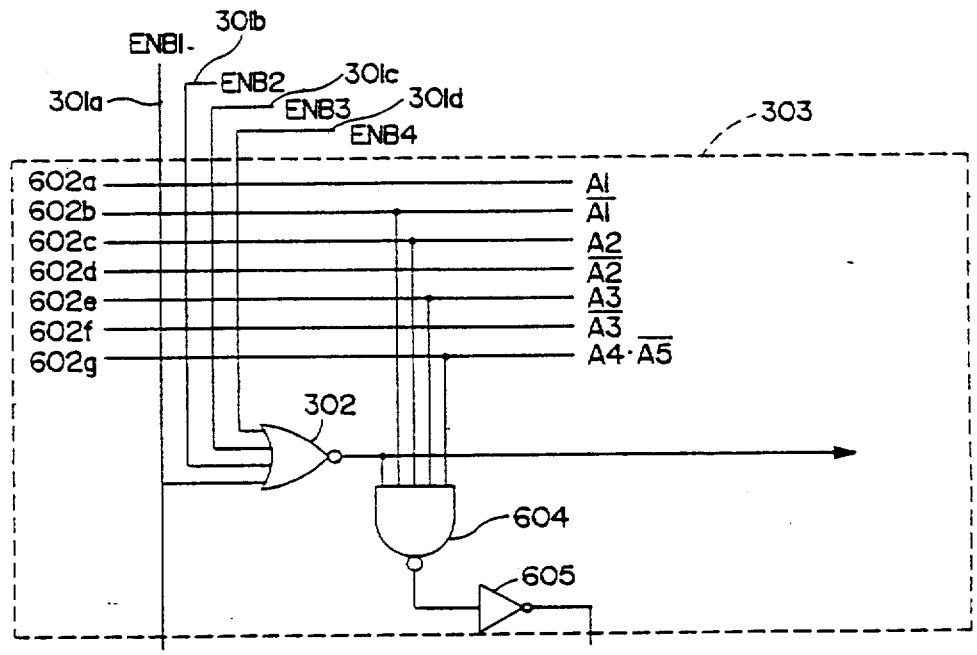

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

Page 7 of 11

Figure 5:
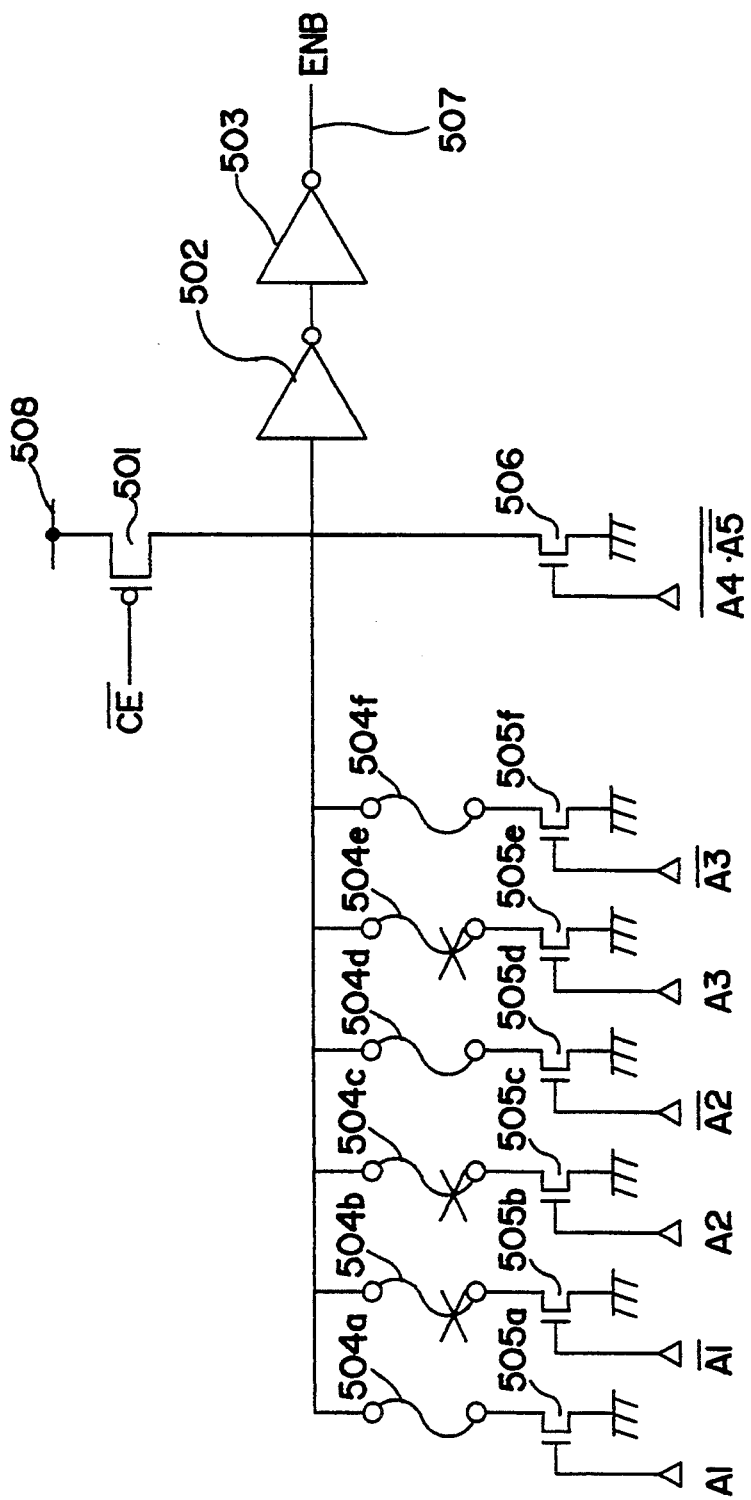
FIG. 5 shows an exemplary conventional configuration of a redundancy decoder.

It is certified that error appears in the above-identified patent and that said Letters Patent is hereby corrected as shown below:

```
In FIG. 5 to the left of inverter 502 the connection is:
```

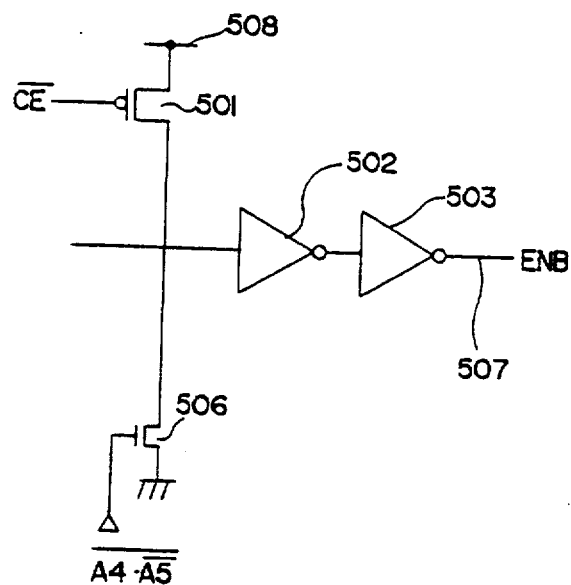

```
the connection should be: (see next page)
```

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

It is certified that error appears in the above-identified patent and that said Letters Patent is hereby corrected as shown below:

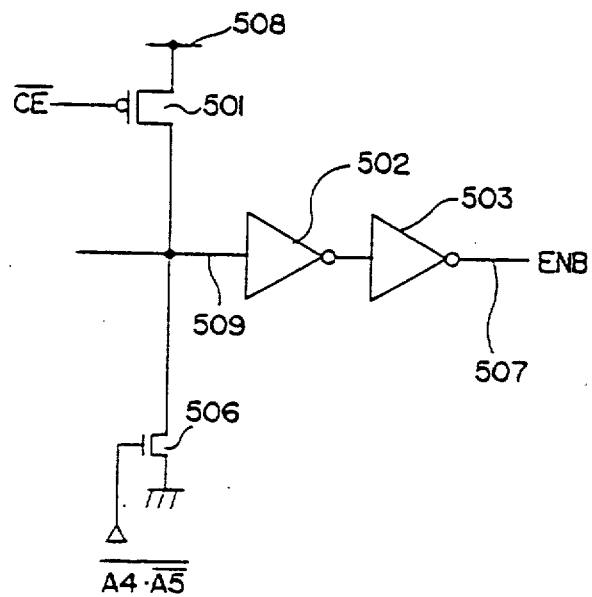

UNITED STATES PATENT AND TRADEMARK OFFICE
CERTIFICATE OF CORRECTION

PATENT NO. : 5,375,090
DATED : DECEMBER 20, 1994
INVENTOR(S) : M. YOSHIDA

Figure 6:
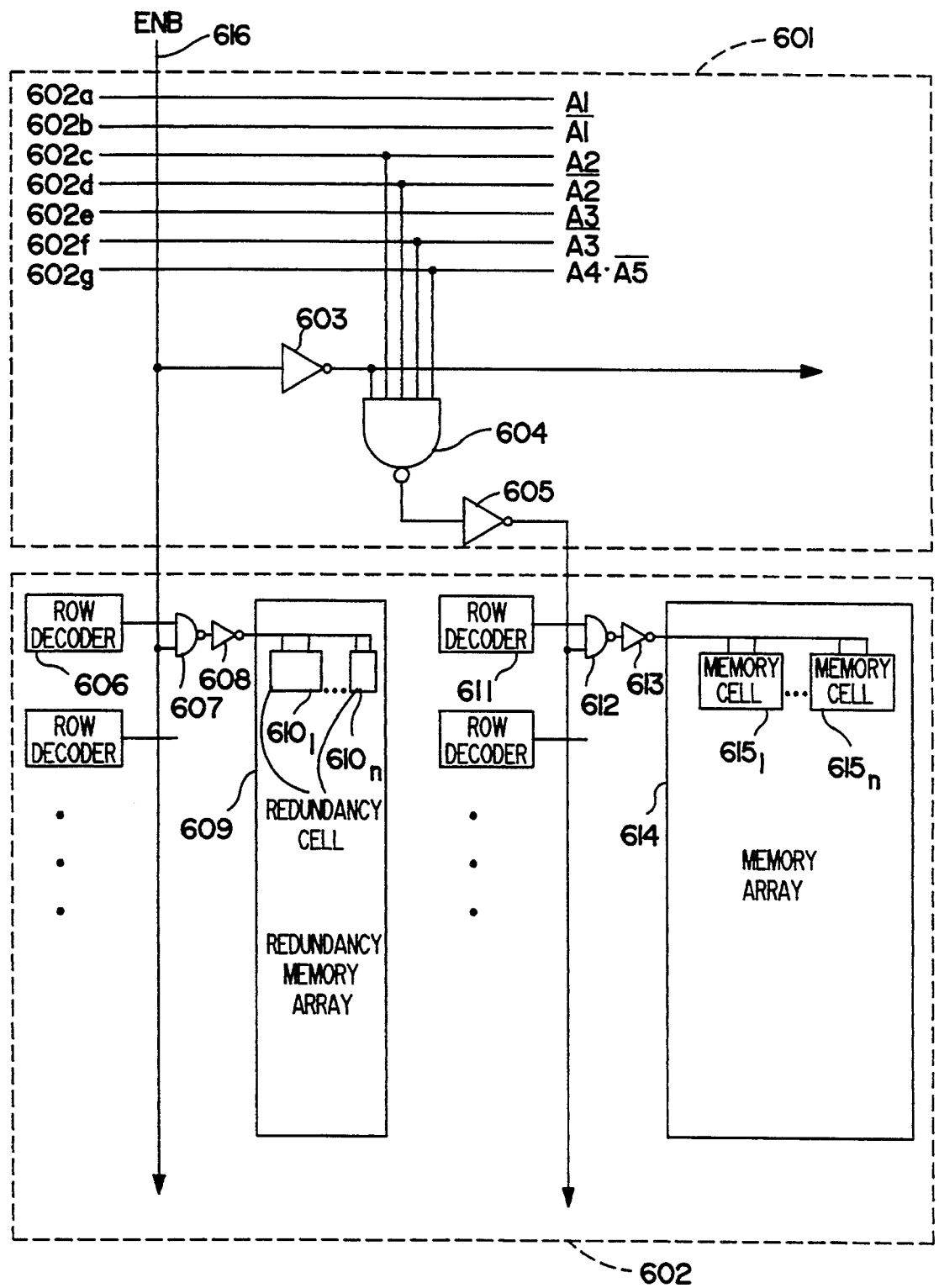
FIG. 6 shows an exemplary conventional configuration of a memory cell group selection decoder and a conventional configuration of a memory cell group corresponding thereto.

It is certified that error appears in the above-identified patent and that said Letters Patent is hereby corrected as shown below:

In FIG. 6 the interconnection between gate 604 and address lines 602a through 602g inside block 601 is:

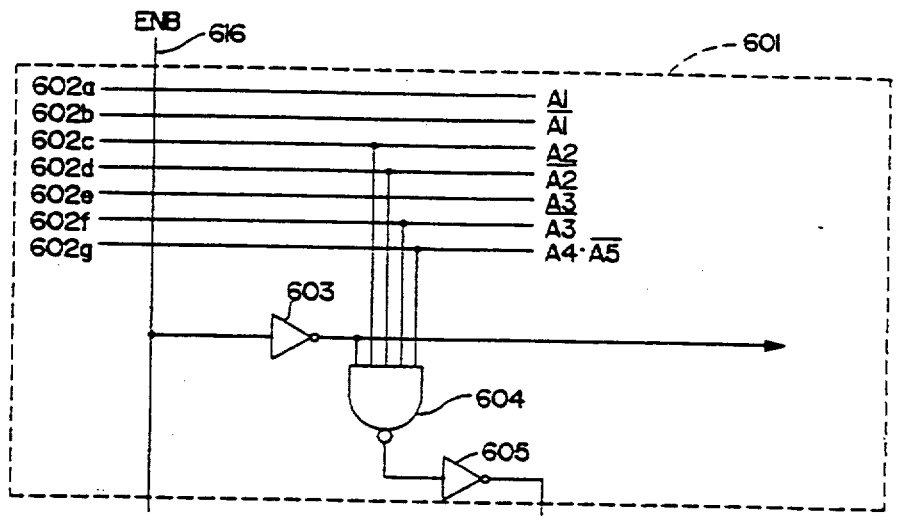

the connections should be: (see next page)

UNITED STATES PATENT AND TRADEMARK OFFICE
CERTIFICATE OF CORRECTION

PATENT NO. : 5,375,090

DATED : DECEMBER 20, 1994

INVENTOR(S) : M. YOSHIDA

It is certified that error appears in the above-identified patent and that said Letters Patent is hereby corrected as shown below:

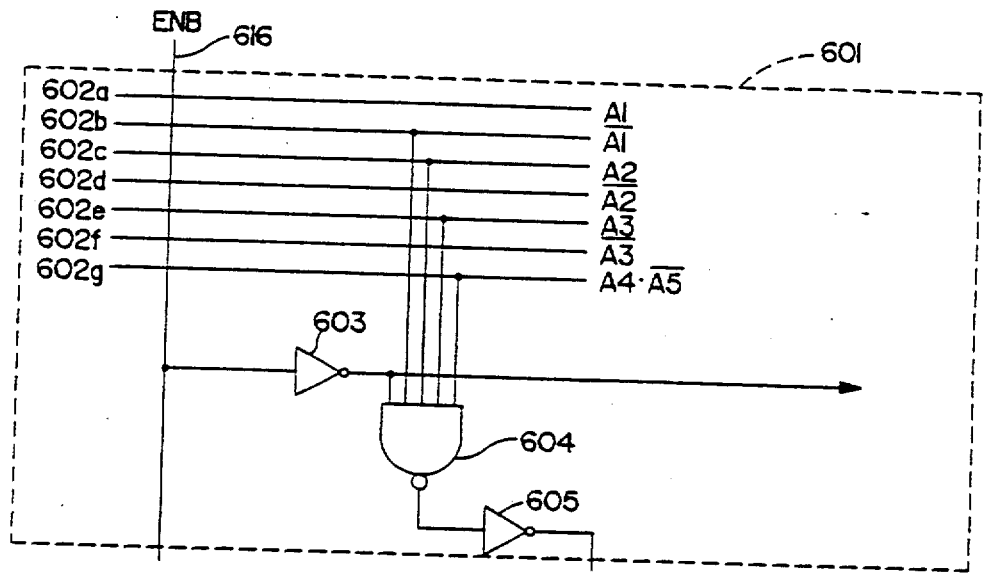

UNITED STATES PATENT AND TRADEMARK OFFICE
CERTIFICATE OF CORRECTION

PATENT NO. : 5,375,090
DATED : December 20, 1994
INVENTOR(S) : M. Yoshida

It is certified that error appears in the above-indentified patent and that said Letters Patent is hereby corrected as shown below:

Col. 10, line 23,
In claim 2, line 6: Is: "cells at least"
should read: --cells in at least--;

Col. 10, line 25,
claim 3, line 2: Is: wherein each or said"
should read: --wherein each of said--.

Signed and Sealed this

Eighteenth Day of July, 1995

Attest:

BRUCE LEHMAN

Attesting Officer

Commissioner of Patents and Trademarks